(12) United States Patent
Pollmann-Retsch (10) Patent No.: US 9,515,453 B2
(45) Date of Patent: Dec. 6, 2016

(54) MOUNTING LAYER FOR COOLING STRUCTURE

(71) Applicant: KONINKLIJKE PHILIPS N.V., Eindhoven (NL)

(72) Inventor: Jens Pollmann-Retsch, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/889,705

(22) PCT Filed: May 7, 2014

(86) PCT No.: PCT/EP2014/059285
§ 371 (c)(1),
(2) Date: Nov. 6, 2015

(87) PCT Pub. No.: WO2014/180874
PCT Pub. Date: Nov. 13, 2014

(65) Prior Publication Data
US 2016/0118770 A1     Apr. 28, 2016

(30) Foreign Application Priority Data
May 8, 2013   (EP) .................................... 13166943

(51) Int. Cl.
*H01S 3/04* (2006.01)
*H01S 5/024* (2006.01)
(Continued)

(52) U.S. Cl.
CPC ......... *H01S 5/02469* (2013.01); *B23K 1/0016* (2013.01); *H01S 5/02252* (2013.01);
(Continued)

(58) Field of Classification Search
CPC .............. H01S 5/02469; H01S 5/02272; H01S 5/02268; H01S 5/02476; H01S 5/183; H01S 5/423; H01S 5/15; H01S 5/02252
(Continued)

(56) References Cited

U.S. PATENT DOCUMENTS 6,555,479 B1    4/2003  Hause et al.
7,317,742 B2 *  1/2008  Saito ................... G02B 6/4201
                                                                372/26
(Continued)

FOREIGN PATENT DOCUMENTS

CN       201490221 U    5/2010
CN       201521907 U    7/2010
(Continued)

OTHER PUBLICATIONS

IBM Technical Disclosure Bullettin, IBM Corp., "Alignment and Bond Patterns for Surface Emitting Lasers" vol. 39. No. 2, Feb. 1, 1996, pp. 29-31, XP000559807.

*Primary Examiner* — Kinam Park (57) ABSTRACT

The invention describes a mounting layer (200) for mounting at least two light emitting semiconductor devices. The mounting layer (200) comprises corner protrusion (205) and edge protrusion (210) for aligning the mounting layer (200) to the cooling structure (100). The mounting layer (200) further comprises aligning mounting holes (215) defining mounting areas (270) for mounting the light emitting semiconductor devices. The mounting layer (200) enables, for example, manufacturing of a μ-channel cooler with mounting areas (270) by means of one direct bonding process. Tolerances may thus be reduced. The invention further describes a cooling structure (100) like a μ-channel cooler comprising such a mounting layer (200) and a light emitting structure comprising such a cooling structure (100). Furthermore, (Continued)

methods of manufacturing such a mounting layer (200), cooling structure (100) and light emitting structure are described.

15 Claims, 7 Drawing Sheets

(51) Int. Cl.
  *H01S 5/18* (2006.01)
  *H01S 5/022* (2006.01)
  *B23K 1/00* (2006.01)
  *H01S 5/183* (2006.01)
  *H01S 5/42* (2006.01)
  *H01L 25/075* (2006.01)
  *H01L 33/64* (2010.01)

(52) U.S. Cl.
  CPC ............ *H01S 5/02272* (2013.01); *H01S 5/18* (2013.01); *H01S 5/183* (2013.01); *H01S 5/423* (2013.01); *H01L 25/0753* (2013.01); *H01L 33/648* (2013.01); *H01L 2924/0002* (2013.01); *H01S 5/02268* (2013.01); *H01S 5/02476* (2013.01)

(58) Field of Classification Search
  USPC .......................................... 372/34
  See application file for complete search history.

(56) References Cited

U.S. PATENT DOCUMENTS

| | | | |
|---|---|---|---|
| 7,932,132 B2 | 4/2011 | Miyajima et al. | |
| 8,324,633 B2 | 12/2012 | McKenzie et al. | |
| 8,327,540 B2 | 12/2012 | Michel et al. | |
| 2007/0065984 A1 | 3/2007 | Lau et al. | |
| 2007/0164425 A1 | 7/2007 | Kolan et al. | |
| 2010/0187546 A1* | 7/2010 | Fushimi ................. | H01L 33/62 257/88 |
| 2010/0315815 A1* | 12/2010 | Lin ........................... | F21K 9/00 362/249.01 |
| 2011/0260181 A1* | 10/2011 | Kobilke ................ | H01L 33/648 257/89 |
| 2012/0129245 A1* | 5/2012 | Neeb ...................... | C12M 21/02 435/257.1 |
| 2015/0311673 A1* | 10/2015 | Wang ................. | H01S 5/18355 372/27 |

FOREIGN PATENT DOCUMENTS

| | | |
|---|---|---|
| CN | 201526917 U | 7/2010 |
| DE | 202008012361 U1 | 12/2012 |
| JP | 2006339212 A | 12/2006 |

\* cited by examiner

MOUNTING LAYER FOR COOLING STRUCTURE

CROSS-REFERENCE TO PRIOR APPLICATIONS

This application is the U.S. National Phase application under 35 U.S.C. §371 of International Application No. PCT/EP2014/059285, filed on May 7, 2014, which claims the benefit of European Patent Application No. 13166943.3, filed on May 8, 2013. These applications are hereby incorporated by reference herein.

FIELD OF THE INVENTION

The invention relates to a mounting layer for mounting light emitting semiconductor devices, a cooling structure comprising the mounting layer and a light emitting structure comprising the cooling structure and at least two light emitting semiconductor devices. The invention further relates to methods of manufacturing the mounting layer, the cooling structure and the light emitting structure.

BACKGROUND OF THE INVENTION

Figure 4:
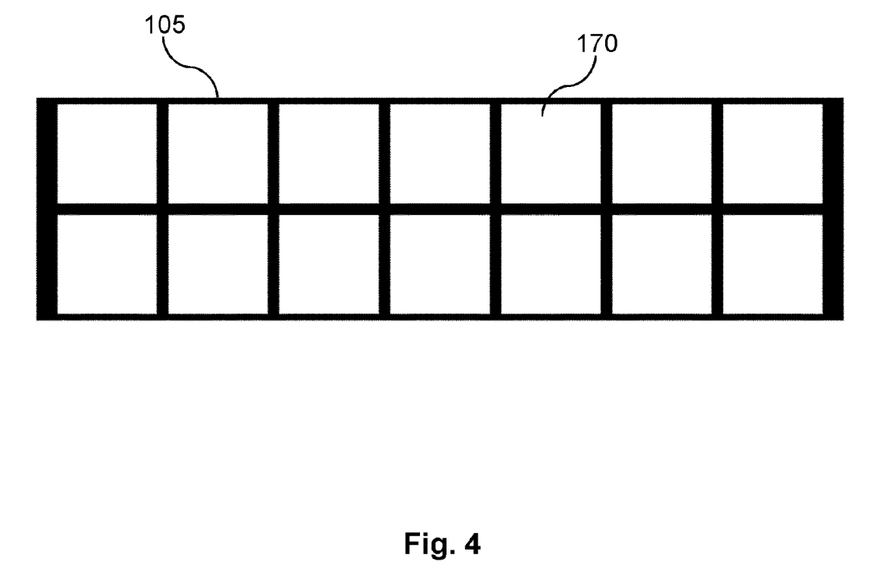
FIG. 4 shows a top-view of the surface of a μ-channel cooler after structuring.

In a typical high-power Vertical Cavity Surface Emitting Laser (VCSEL)-array assembly, several light emitting semiconductor devices as, for example, submounts comprising a certain number of VCSEL-array chips will be mounted together on mounting areas of the same cooling structure as, for example, a μ-channel cooler. As preparation for the assembly- or mounting process, trenches are cut into the top surface of these μ-channel coolers to create a (typically rectangular) structure of mounting areas as shown in FIG. 4. This usually is done in a separate laser-structuring step, after manufacturing of the μ-channel coolers. The structure in the top surface mainly serves as a solder-stop; in this way, a defined positioning of the submounts on the cooler-surface is achieved. This in turn helps avoiding electrical contacts and shorts between the submounts and allows a better definition of the laser-radiation-emitting area from the cooler. Another purpose of the trenches in the cooler surface is to provide for a reservoir for excess solder during the soldering of the submounts.

The described method of manufacturing the mounting areas and consequently the cooling structure is time-consuming, costly and may introduce additional tolerances with respect to the positioning of the submounts which may be inacceptable for applications requiring precise control of the positioning.

SUMMARY OF THE INVENTION

It's thus an object of the present invention to provide an easy to manufacture mounting layer for mounting at least two light emitting semiconductor devices with high positioning accuracy, a corresponding cooling structure and light emitting structure. It's a further object to provide a corresponding method of manufacturing such a mounting layer, cooling structure and light emitting structure.

According to a first aspect a mounting layer for mounting at least two light emitting semiconductor devices is provided, the mounting layer comprises corner protrusion and edge protrusion for aligning the mounting layer to a cooling structure, the mounting layer further comprises aligning holes defining mounting areas for mounting the light emitting semiconductor device. The number of mounting areas may be adapted to the application such that two, three, four or a multitude of mounting areas may be defined by means of the aligning holes. The mounting layer may consist of a material suitable for direct bonding to a cooling structure the latter may have the advantage that that mounting layer can be attached to a cooling body by means of direct bonding techniques also used for the assembly of the bonding structure. Direct bonding means in this respect that no additional or intermediate layers are needed in order to bond the layers. The corner and edge protrusions may be used in such a direct bonding process to align the mounting layer to the cooling body. The aligning holes may enable a good positioning of the light emitting semiconductor device by defining the contact area between the light emitting semiconductor device and the mounting layer. Materials as adhesive or solder used to stick a light emitting semiconductor device to the mounting area may exert a force to the light emitting semiconductor device such that the light emitting semiconductor device are nearly perfectly aligned with the mounting areas defined by the aligning holes. The tolerances may be merely determined by means of the production tolerances of the structuring process of the mounting layer which may also be used for structuring the layers of the cooling body. Thus, no additional laser structuring may be needed in order to provide the mounting areas of laser devices such as VCSEL arrays or LEDs. The latter may have the additional advantage that there are no additional tolerances which are added by means of a different technology used for structuring the surface of the cooling body.

The material of the mounting layer may be suitable for solder bonding and/or comprises a coating as, for example, an Au coating to enable solder bonding of the light emitting semiconductor device. Especially solder may be well suited to align the light emitting semiconductor device during the bonding process.

The material of the mounting layer may advantageously have a high thermal conductivity above 10 W/(m*K). A high thermal conductivity does have the advantage that heat may be transferred faster from the light emitting semiconductor device to the cooling structure. Especially Copper may be suited with, depending on the purity of the material, a thermal conductivity of above 200 W/(m*K). Soft Copper, for example, is very well suited for direct bonding and is also currently used for cooling bodies like μ-channel coolers assembled by means of direct bonding. Anyhow, thermal conductivity of the material may be less important in case of thin mounting layers such that materials like stainless steel or silicon may be used. The thickness of the mounting layer may vary between 50 μm and 600 μm, but a thickness in the range of 60 μm and 300 μm, or in the range of 70 μm and 200 μm or even between 90 μm and 125 μm may be even more advantageous.

The mounting layer may further comprise a barrier solder reservoir being arranged in a way that spilling of excess solder between adjacent mounting areas is reduced. Excess solder may influence the accuracy of the positioning process (floating of the light emitting semiconductor device) such that no excess solder should flow from one mounting area to an adjacent mounting area. The barrier solder reservoirs are holes in the mounting layer providing a recess after bonding the mounting layer to the cooling body. Barrier solder reservoirs arranged at the edges and/or corners of the mounting areas being in contact with at least one adjacent mounting area may thus absorb such excess solder. The same effect may be used if liquid adhesives are used to stick the light emitting semiconductor device to a mounting area. Such recesses provided by holes in the mounting layer may also be used to provide one or more solder reservoirs within the area of the mounting areas. Excess solder (or adhesive) can be absorbed by means of the solder reservoir which may, for example, be positioned at the center of the mounting areas. It may also be possible to provide, for example, four solder reservoirs at the corners of a rectangular mounting area. It may be important to adapt the size of the aligning holes, barrier solder reservoirs and the solder reservoirs such that the structural integrity of the mounting layer is not endangered.

According to a further aspect a cooling structure comprising a cooling body like a μ-channel cooler may be provided which is bonded to the mounting layer. The mounting layer may be directly bonded or welded to the cooling body.

Furthermore a light emitting structure may be provided. The light emitting structure comprises the cooling structure with the mounting layer and at least two light emitting semiconductor devices. The light emitting semiconductor devices may be semiconductor lasers like VCSEL or VCSEL arrays or LEDs soldered to the mounting areas. The cooling structure with mounting layer may be especially useful if used in combination with semiconductors needing good cooling and excellent alignment as semiconductor lasers.

According to a further aspect a method of manufacturing a mounting layer for mounting a light emitting semiconductor device is provided. The method comprises the steps of
  providing a sheet of material,
  providing corner protrusion and edge protrusion in the sheet of material for aligning the mounting layer to a cooling structure, and
  providing aligning holes defining mounting areas in the sheet of material for mounting the light emitting semiconductor device.

The material used for the mounting layer is preferably suited for direct bonding processes. In addition barrier solder reservoirs may be provided in the sheet of material. The barrier solder reservoirs are arranged in a way that spilling of excess solder between adjacent mounting areas is reduced. Alternatively or in addition barrier reservoirs may be arranged in the area of the mounting areas. Corner protrusions, edge protrusions, aligning holes, barrier solder reservoirs and solder reservoirs may be provided by means laser processing or etching.

According to a further aspect a method of manufacturing a cooling structure is provided. The method comprises the steps of
  providing a cooling body, and
  bonding a mounting layer as described above to the cooling body.

The cooling body may be a separate structure which is manufactured in a separate manufacturing process. An example may be a block of copper with cooling channels processed by drilling or the like. Alternatively two blocks of copper may be provided and the cooling channels may be provided by means of laser processing or etching in one surface of each block and bonding the processed surfaces to each other. The mounting layer may, for example be welded to the cooling body. In an alternative approach a number of layers suited for direct bonding like copper layers building the cooling body may be stacked on each other. The mounting layer consisting of the same copper material may be aligned to the stack by means of the corner and edge protrusions on the side of the cooling body light emitting structures should be positioned on. Finally, all layers of the cooling body and the mounting layer may be bonded to each other by means of direct bonding in one process step. An example of such a direct bonding process is thermal bonding by means of heating the layers, which directly bonds neighboring layers via melting and/or diffusion processes. Cu layers may, for example, be direct bonded under vacuum conditions by means of annealing the layer stack. The annealing or bonding temperature may depend on a surface activation of the Cu layers which can be done, for example, by means of low energy Ar ion beams of 40-100 eV or via oxidation. Even room temperature bonding may be possible by preparing the surfaces of the layers by means of ion beams.

According to a further aspect a method of manufacturing a light emitting structure is provided. The method comprises the steps of
  providing a cooling structure as described above, and
  attaching on mounting areas at least two light emitting semiconductor devices.

The at least two light emitting semiconductor devices may be soldered or glued to the mounting areas of the mounting layer. The method may have the advantage that light emitting structures like LEDs or especially semiconductor lasers as VCSELs may be precisely arranged in an easy way. The production of laser systems comprising a multitude of lasers may thus be simplified and the alignment of the laser chips comprising, for example, VCSEL arrays may be improved.

It shall be understood that the mounting layer of claim 1 and the method of claim 11 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
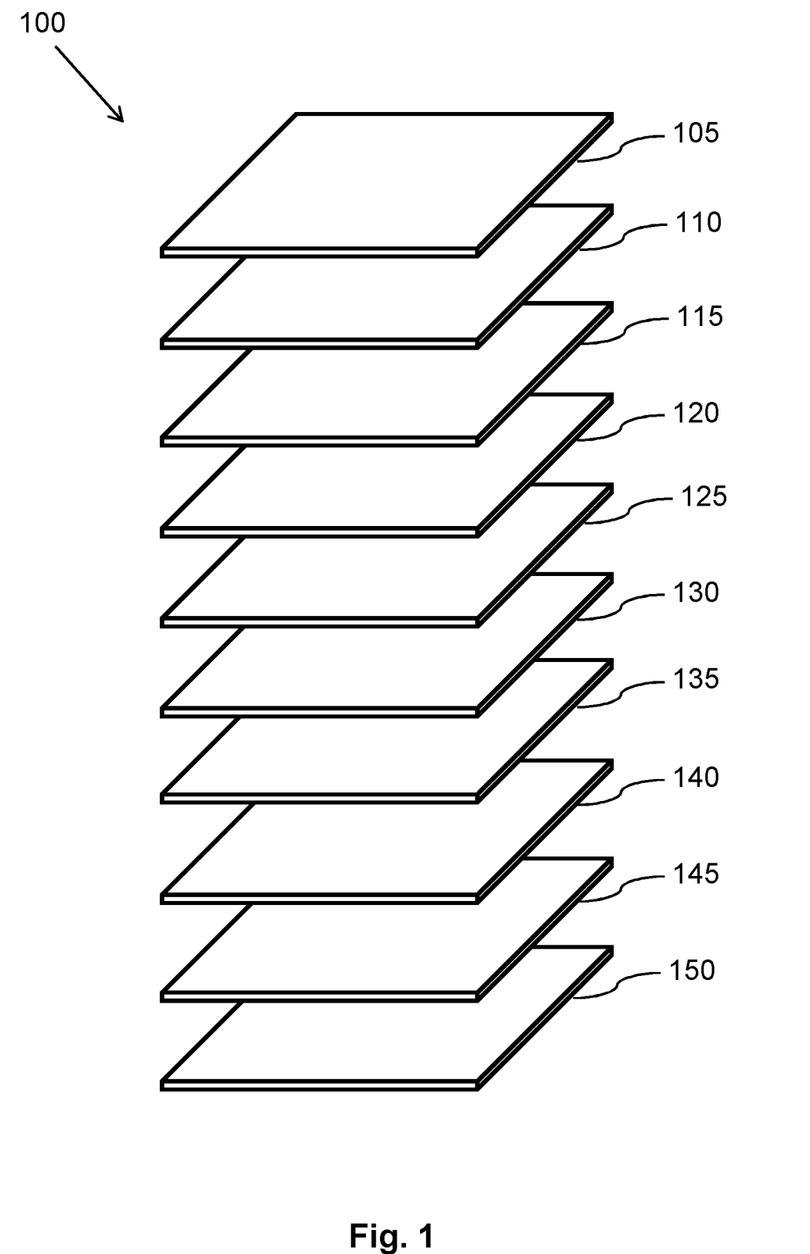
FIG. 1 shows a layer structure of a μ-channel cooler.
Figure 2:
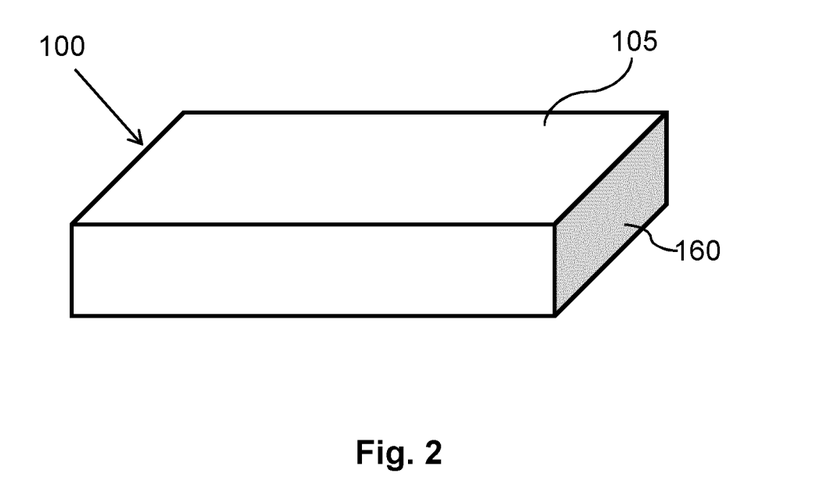
FIG. 2 shows a tilted top view of the μ-channel cooler.
Figure 3:
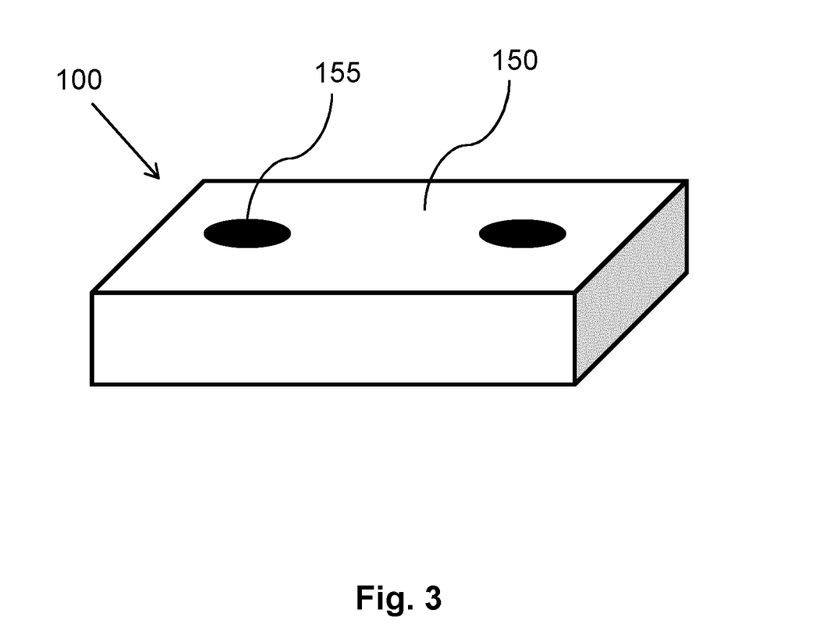
FIG. 3 shows a tilted bottom view of the μ-channel cooler.

FIG. 1 shows a layer structure of a μ-channel cooler. The μ-channel cooler is made by a process during which a number of thin Copper sheets (typically 50 μm to 600 μm thick) are directly bonded together at high temperature. Each of these copper sheets can be structured separately, e.g. in order to create the μ-channels for the heat-transfer or to create larger holes for water-supply or fixation of the cooler. The layer structure comprises in this case top layer 105, a first cooling layer 110, a second cooling layer 115, a first separation layer 120, a manifold layer 125, a second separation layer 130, a first bolt layer 135, a nut layer 140, a second bolt layer 145 and a bottom layer 150. The layers form the cooling body of the μ-channel cooler after direct bonding in a vacuum chamber. A tilted top view of the cooling body of the μ-channel cooler is shown in FIG. 2 with the top layer 105 and a sidewall 160 built by the stacked and bonded copper layers. In FIG. 3 a tilted bottom view of the cooling body of the μ-channel cooler is shown. Coolant supply holes 155 are provided in the bottom layer 150 of the cooling body.

FIG. 4 shows a top-view of the top surface of a μ-channel cooler after structuring the top layer 105. The cooler shall carry 2 rows of 7 submounts each, separated by small trenches (in the order of 100 μm wide). In the current process, the dark areas will be removed via laser-structuring (down to a depth in the order of 100 μm), leaving the light "islands" the mounting areas 170 where the submounts will be positioned. The additional laser-structuring step of the cooler surface after the assembly of the cooling body of the μ-channel cooler itself has several disadvantages. First, of course, it is more costly and time-consuming. Furthermore, for applications where precise control of the submount positioning is necessary, the structuring step may introduce additional tolerances. Typically, the μ-channel coolers provide some means to enable exact positioning (e.g., alignment pins at the bottom). The laser-structuring step has to build upon the accuracy of these alignment means to create the required positioning structure for the submounts, while at the same time adding its own tolerances to the total tolerance chain.

Figure 5:
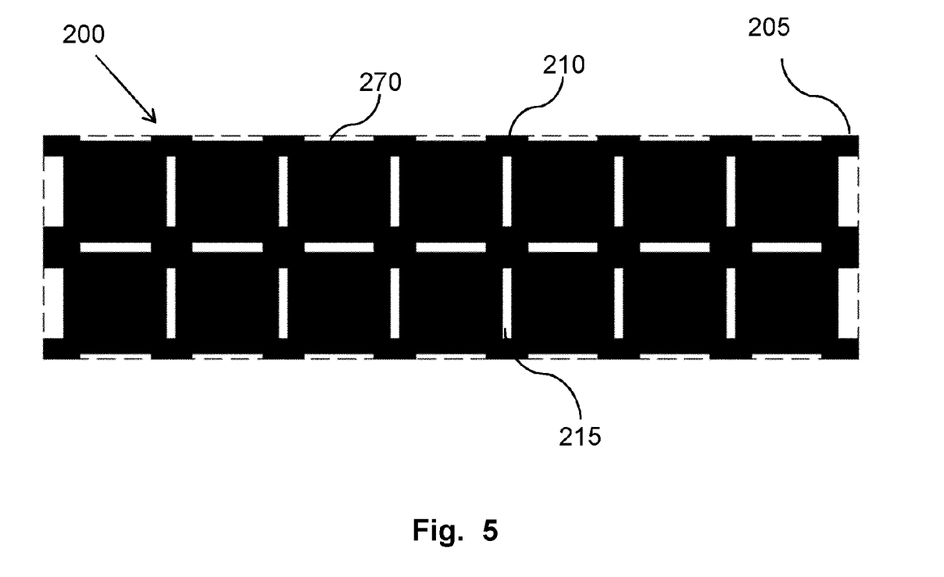
FIG. 5 shows a first embodiment of a mounting layer according to the present invention.

FIG. 5 shows a first embodiment of a mounting layer 200 according to the present invention. A Copper sheet whose thickness is in the same order as the current depth of the trenches is created, by using the standard etching technology also employed to create the μ-channels of the heat-transfer layer inside the cooling body of the cooling body of the μ-channel cooler. This technology allows for structure-sizes in the required range. Since in this technology, several μ-channel coolers are manufactured at the same time on so-called mastercards (of size A5), the layout of the structured sheet has to take care that no isolated copper regions without any connection to the surrounding carrier result. FIG. 5 shows an example of such a structure, which would essentially create mounting areas 270 of the same size as shown in FIG. 4. The small copper-protrusions along the edges, the so called edge protrusions 210, provide the connections to the neighboring sheets or the carrying structure (on the mastercard). The lengths and width of the aligning holes 215 that separate and define the mounting areas 270 can be adjusted to the requirements of the application (e.g., the size of the submounts). The dashed line indicates the outer boundaries of the μ-channel cooler. When the stack of Copper-sheets are arranged (before the direct-bonding process), the mounting layer 200 can be aligned correctly to the other sheets 105-150 (and potential alignment means) on top of the top layer 105 by using the edge protrusions 210 and corner protrusions 205. The μ-channel cooler is again formed by direct bonding layers 105-150 and mounting layer 200 in one direct bonding process.

Figure 6:
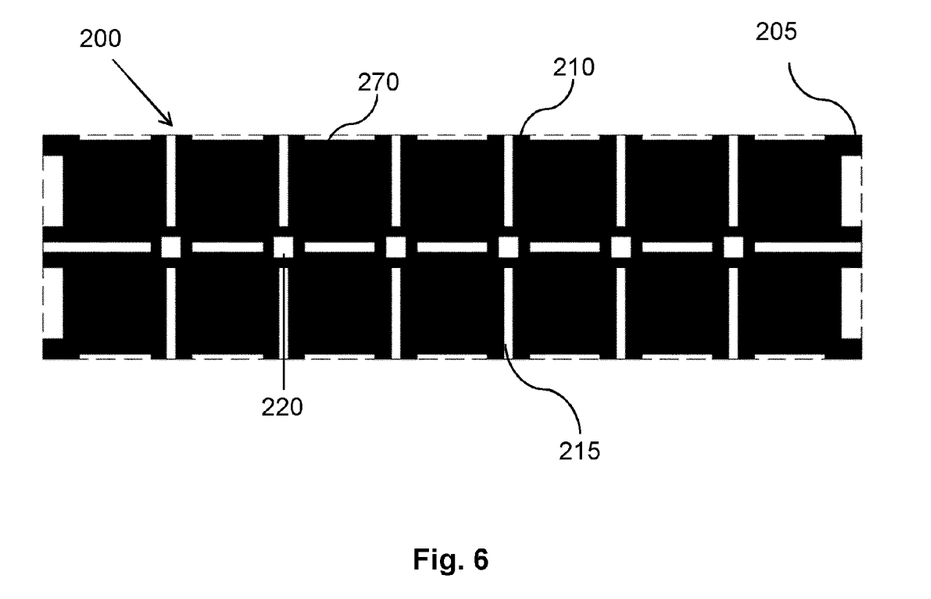
FIG. 6 shows a second embodiment of a mounting layer according to the present invention.

FIG. 6 shows a second embodiment of a mounting layer according to the present invention. In case that a spilling of excess solder to other islands via the central connections shall be avoided, a barrier solder reservoir 220 may be helpful. By etching an additional hole, the barrier solder reservoir 220, into these central areas (here: quadratic), on the one hand the connecting links are smaller. Furthermore, the barrier solder reservoir 220 may act as a reservoir that can absorb a certain amount of excess solder.

Figure 7:
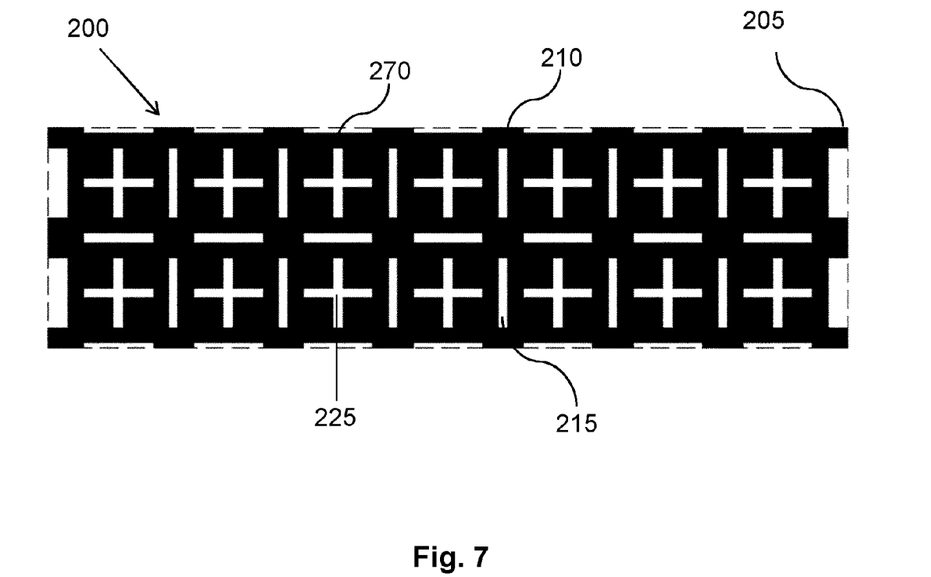
FIG. 7 shows a third embodiment of a mounting layer according to the present invention.

FIG. 7 shows a third embodiment of a mounting layer according to the present invention. Solder reservoirs 225 can also be included in the mounting area 270 themselves. Due to the good control over the structure-size and -shape using the etching technology, a wide range of possible solder reservoir types is conceivable. These solder reservoirs 225 have to be designed in such a way, that at the same time they will not interfere with the good submount-positioning capabilities of the mounting layer 100 and especially the mounting areas 270.

Figure 8:
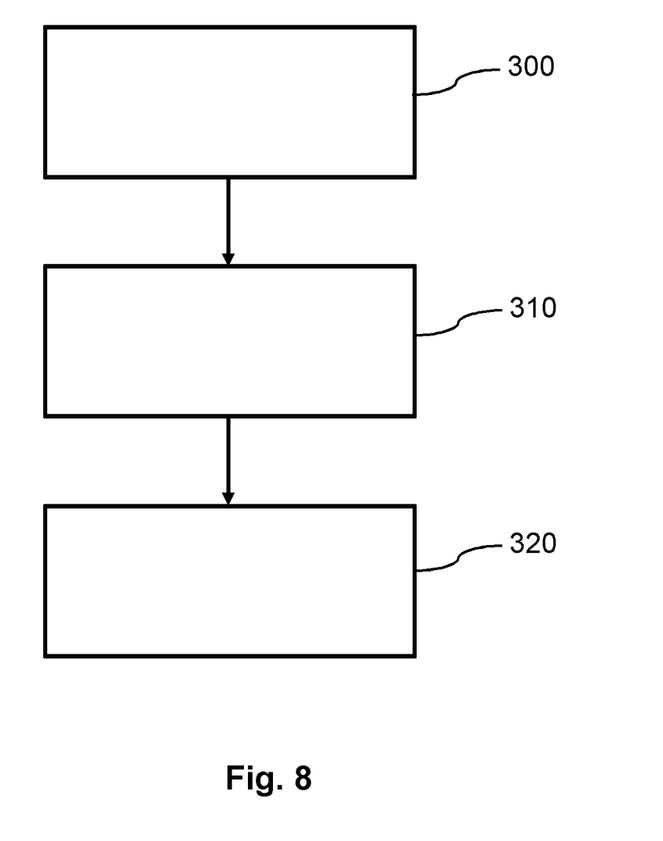
FIG. 8 shows a principal sketch of a method of manufacturing a mounting layer.

FIG. 8 shows a principal sketch of a method of manufacturing the mounting layer. In step 300 a sheet of material is provided being suited to mount light emitting semiconductor devices like LEDs or semiconductor lasers as VCSEL or chips with VCSEL arrays. In step 310 corner protrusion 205 and edge protrusion 210 for aligning the mounting layer 200 to a cooling structure 100 are provided in the sheet of material by means of etching or laser processing. In step 320 aligning holes 215 defining mounting areas 270 for mounting the light emitting semiconductor device are provided in the sheet of material by means of etching or laser processing. The sheet of material may be a copper sheet with high thermal conductivity and a thickness between 50 μm and 300 μm. In a subsequent, parallel or prior processing step barrier solder reservoirs 220 may be provided in the sheet of material by means of etching or laser processing. The barrier solder reservoirs 220 are arranged in a way that spilling of excess solder between adjacent mounting areas 270 is reduced. Finally, solder reservoirs 225 may be provided in the area of the mounting areas 270 by means of etching or laser processing. The described sequence of process steps is not mandatory and may be adapted to the needs of the production or manufacturing process.

Figure 9:
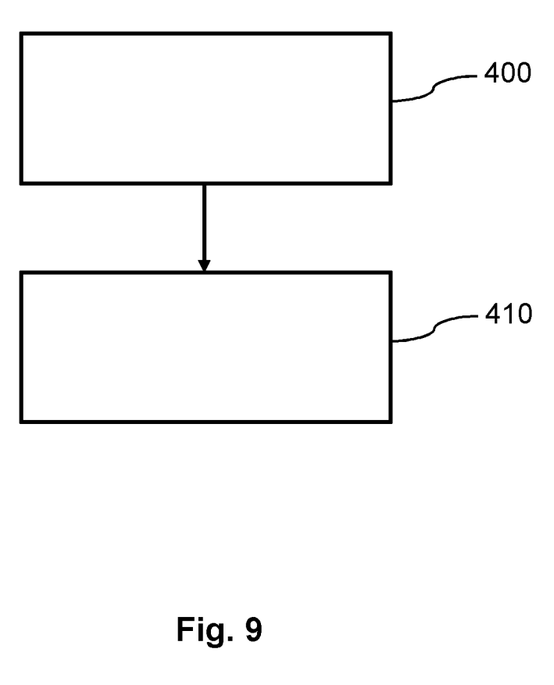
FIG. 9 shows a principal sketch of a method of manufacturing a cooling structure like a μ-channel cooler.

FIG. 9 shows a principal sketch of a method of manufacturing a cooling structure like a μ-channel cooler. In step 400 a cooling body may be provided. The cooling body may be provided by means of drilling, for example, a block of copper. Alternatively, Copper sheets or layers may be bonded to each other in a vacuum chamber by means of direct bonding. In step 410 a mounting layer comprising at least corner protrusions 205, edge protrusions 210 and aligning holes 215 is bonded to the cooling body. The bonding step may happen after assembling the cooling body. Alternatively, sheets of, for example, copper forming the cooling body and the mounting layer 200 are bonded to each other in one direct bonding process in a vacuum chamber. The direct bonding process may have the advantage that the cooling structure including the mounting areas may be produced in an easy way with high precision.

Figure 10:
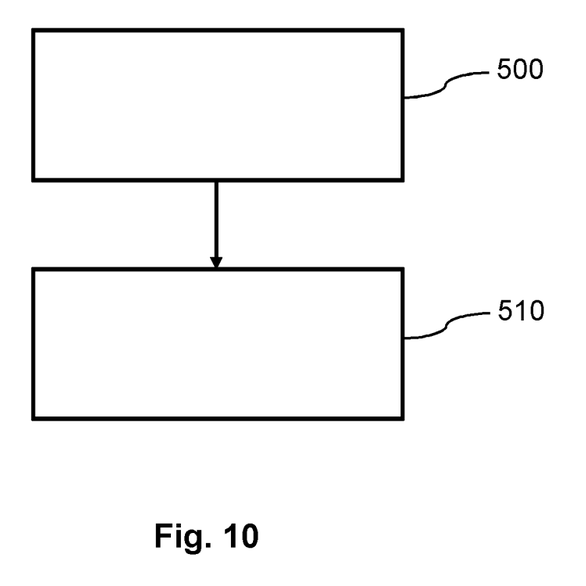
FIG. 10 shows a principal sketch of a method of manufacturing a light emitting structure.

FIG. 10 shows a principal sketch of a method of manufacturing a light emitting structure. In step 500 a cooling structure 100 comprising a cooling body and a mounting layer 200 is provided. In step 510 at least two light emitting semiconductor devices like LEDs or VCSELs are attached to the mounting areas 270 of the mounting layer 200. The light emitting semiconductor devices may be attached by means of gluing or soldering. The surface tension of the glue or the solder may align the light emitting semiconductor devices to the mounting areas 270 of the mounting layer 200 thus enabling high precision light emitting structures.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

100 μ-channel cooler
105 top layer
110 first cooling layer
115 second cooling layer
120 first separation layer
125 manifold layer
130 second separation layer
135 first bolt layer
140 nut layer
145 second bolt layer
150 bottom layer
155 coolant supply hole
160 sidewall
170, 270 mounting areas
200 mounting layer
205 corner protrusion
210 edge protrusion
215 aligning hole
220 barrier solder reservoir
225 solder reservoir
300 step of providing a sheet of material
310 step of providing corner protrusions and edge protrusions
320 step of providing aligning holes
400 step of providing a cooling body
410 step of providing a mounting layer
500 step of providing a cooling structure
510 step of attaching light emitting semiconductor devices

The invention claimed is:

1. A mounting layer for mounting at least two light emitting semiconductor devices, the mounting layer comprising a sheet of material, the mounting layer further comprising a corner protrusion and an edge protrusion for aligning the mounting layer to a cooling structure, the mounting layer further comprising aligning holes defining mounting areas for mounting the light emitting semiconductor device, the material being configured to be directly bonded or welded to the cooling structure.

2. The mounting layer according to claim 1, wherein the material of the mounting layer or a coating on top of the mounting layer is suitable for solder bonding of the light emitting semiconductor devices.

3. The mounting layer according to claim 1, wherein the material of the mounting layer is characterized by thermal conductivity above 10 W/(m*K).

4. The mounting layer according to claim 1, wherein the mounting layer has a thickness between 50 μm and 600 μm.

5. The mounting layer according to claim 2, the mounting layer further comprising a barrier solder reservoir being arranged in a way that spilling of excess solder between adjacent mounting areas is reduced.

6. The mounting layer according to claim 2, the mounting layer further comprising a solder reservoir being arranged in the area of the mounting areas.

7. A cooling structure comprising a cooling body bonded to the mounting layer according to claim 1.

8. The cooling structure according to claim 7 being a μ-channel cooler.

9. A light emitting structure comprising the cooling structure according to claim 7 and at least two light emitting semiconductor devices.

10. The light emitting structure according to claim 9, wherein the light emitting semiconductor devices are semiconductor lasers.

11. A method of manufacturing a mounting layer for mounting a light emitting semiconductor device, the method comprising the steps of
providing a sheet of material, the material being configured to be directly bonded or welded to a cooling structure,
providing corner protrusion and edge protrusion in the sheet of material for aligning the mounting layer to a cooling body of the cooling structure, and
providing aligning holes defining mounting areas in the sheet of material for mounting the light emitting semiconductor device.

12. The method according to claim 11 comprising the further step of providing a barrier solder reservoir in the sheet of material being arranged in a way that spilling of excess solder between adjacent mounting areas is reduced.

13. The method according to claim 11 comprising the further step of providing a solder reservoir being arranged in the area of the mounting areas.

14. A method of manufacturing a cooling structure comprising the steps of
providing a cooling body, and
bonding a mounting layer according to claim 1 to the cooling body.

15. A method of manufacturing a light emitting structure comprising the steps of
providing the cooling structure according to claim 7, and
attaching on mounting areas at least two light emitting semiconductor devices.

* * * * *